United States Patent [19]
Naito

[11] Patent Number: 4,620,178
[45] Date of Patent: Oct. 28, 1986

[54] DOUBLE INTEGRATING-TYPE ANALOG-TO-DIGITAL CONVERTER

[75] Inventor: Kazufumi Naito, Ohtsu, Japan
[73] Assignee: Kabushiki Kaisha Ishida Koki Seisakusho, Kyoto, Japan
[21] Appl. No.: 580,690
[22] Filed: Feb. 16, 1984
[30] Foreign Application Priority Data Feb. 16, 1983 [JP] Japan ............... 58-025149
Feb. 18, 1983 [JP] Japan ............... 58-026642

[51] Int. Cl.⁴ ............................................ H03K 13/02
[52] U.S. Cl. ................... 340/347 NT; 340/347 AD; 340/347 M
[58] Field of Search ............... 340/347 AD, 347 NT; 177/DIG. 3

[56] References Cited

U.S. PATENT DOCUMENTS

| | | | |
|---|---|---|---|
| 4,143,724 | 3/1979 | Itani | 177/DIG. 3 |
| 4,268,820 | 5/1981 | Hareyama | 340/347 AD |
| 4,364,028 | 12/1982 | Masuda et al. | 340/347 AD |
| 4,366,468 | 12/1982 | Yoneyama | 340/347 AD |
| 4,404,545 | 9/1983 | Nakanishi et al. | 340/347 AD |

Primary Examiner—Vit W. Miska
Assistant Examiner—Sharon D. Logan
Attorney, Agent, or Firm—Staas & Halsey

[57] ABSTRACT

A double-integrating A/D converter in which an integrator output voltage, produced by integrating an analog signal input thereto, is reverse-integrated in accordance with a reference voltage having a polarity opposite to that of the analog signal. The time required for the reverse integration is measured in the form of a pulse count by means of a counter. A microcomputer for controlling the counter and a switch which selects the input to the integrator are provided with a software timer function so that the integrating interval of the analog input signal is set at will. The microcomputer also is capable of calculating a digital value, which corresponds to the analog signal, from a count recorded in the counter and from an overflow value indicated by an overflow signal generated by the counter. The signal converted by the A/D converter is capable of being applied to the weighing section of an electronic weigher.

15 Claims, 15 Drawing Figures

DOUBLE INTEGRATING-TYPE ANALOG-TO-DIGITAL CONVERTER

CROSS-REFERENCE TO RELATED APPLICATION

This application is related to U.S. Ser. No. 628,305, filed July 6, 1984.

BACKGROUND OF THE INVENTION

This invention relates to a double integrating-type analog-to-digital converter and, more particularly, to a double integrating-type analog-to-digital converter used in an electronic weigher.

An analog-to-digital converter (referred to hereinafter as an "A/D converter") of the double integrating type is suitable for slow measurements at high accuracy and therefore finds use in instruments such as digital voltmeters and electronic weighers. The double integrating-type A/D converter has a control circuit composed entirely of hard-wired logic and therefore is devoid of freedom in terms of converting speed and resolution. This means that the construction of the circuitry must be modified whenever there is a change in the conditions under which the converter is used. Accordingly, double integrating-type A/D converters of this kind are produced in a wide variety of models but in small lots, with attendant high manufacturing cost. Another consequence of such production is the complexity involved in making the arrangements for the manufactured lots. Furthermore, since there is a decline in the conversion precision of a double-integrating A/D converter in cases where the level of the input signal is low, it is necessary to adjust the analog signal input level at a stage prior to the A/D converter in order to obtain a prescribed conversion precision over the full range. In addition, since the capacity of a counter constituting the prior-art double-integrating A/D converter described above imposes a limitation upon the maximum output count, the latter cannot be raised at will.

A variety of electronic weighers having different weighing capacities and weighing accuracies are available. In order to avoid the high manufacturing costs entailed by producing a large variety of weighers in small lots, a conventional practice is to use an identical load cell as a weight sensor and an identical double-integrating A/D converter for converting an output analog signal into a digital signal, with the intention being to utilize common parts and reduce the total number of components. However, when an attempt is made to change the value of the weighing capacity without causing a decline in the resolution of the double-integrating A/D converter, it becomes necessary to adjust the input level of the A/D converter. In the prior art, this means the provision of an amplifier circuit designed for the particular method. For example, in a case where three electronic weighers having respective weighing capacities of 5 kg, 10 kg and 20 kg are to be manufactured using a load cell designed to give an output voltage of 20 mv when weighing 20 kg and a double-integrating A/D converter having a maximum input voltage of 2 v, amplifier circuits having amplifications of 100, 200 and 400 are required for the electronic weighers having the weighing capacities of 20 kg, 10 kg and 5 kg, respectively. Thus, according to the prior art, amplifier circuits conforming to the various weighing capacities must be provided. There is need of an improvement which will afford a simplification in this respect.

SUMMARY OF THE INVENTION

Accordingly, an object of the present invention is to provide a novel double integrating-type A/D converter in which conversion speed and resolution can be altered at will in a simple manner to enhance the general-purpose nature of the converter, and in which a desired conversion precision can be simply obtained over a full range without adjusting the analog signal input level.

Another object of the present invention is to provide a novel double integrating-type A/D converter in which an output count can be raised or lowered irrespective of the construction of the counter used, thereby making it possible to freely select resolution.

A further object of the present invention is to provide a novel double integrating-type A/D converter suitable for an electronic weigher. The A/D converter can be applied to various electronic weighers having different weighing capacities without causing a decline in conversion precision of the converter and without requiring any modification in the pre-stage amplifier circuit.

According to the present invention, the foregoing objects are attained by providing a double integrating-type A/D converter having an integrator for integrating an analog input signal over a prescribed integrating interval. The integrator then operates to integrate its output voltage further in accordance with a reference voltage of a polarity opposite to that of the analog signal. A counter is provided for counting, in the form of clock pulses, the reverse integrating interval of the reference voltage. The reverse integrating interval is the time that is takes for the integrator output voltage to attain a prescribed value. The analog signal is converted into a digital signal by counting the reverse integrating interval. According to a feature of the invention, the interval over which the analog signal is integrated is controlled by a software timer function provided in a microcomputer. By adapting an arrangement in which the microcomputer counts the number of times the counter overflows, the total output count produced by the counter can be calculated from the count recorded in the counter and from the overflow count. In one aspect of the invention, the double integrating-type A/D converter of the foregoing construction is applied to the weighing section of an electronic weigher.

With the foregoing construction, the resolution or converting speed of the A/D converter can be set at will in a simple manner, so that no modification in hardware is necessary when putting the converter to use in different applications. The converter may therefore be mass-produced to lower manufacturing costs. Since the integrating interval of the analog signal can be altered at will, lengthening the integrating interval for analog signals of a low input level makes it possible to achieve a high conversion precision with facility. Accordingly, it is possible to dispense with an analog signal input level adjustment circuit heretofore required in electronic weighers and digital voltmeters of the type that permit selection of the measurement range. This also contributes to a lower manufacturing cost. If an arrangement is adopted wherein the analog signal input level and integrating inverval are adjusted in coordination by utilizing the level adjustment circuit in combination with the A/D converter of the present invention, both the converting speed and resolution of the converter can be controlled simultaneously. Further, by adopting the arrangement wherein the microcomputer counts the number of times the counter overflows to produce the digital output signal from the overflow count and from the count recorded in the counter, the output count can be increased irrespective of the capacity of the counter. This permits the resolution of the A/D converter to be raised by the amount required.

Other features and advantages of the present invention will be apparent from the following description taken in conjunction with the accompanying drawings, in which like reference characters designate the same or similar parts throughout the figures.

DESCRIPTION OF THE PREFERRED EMBODIMENTS

Figure 1:
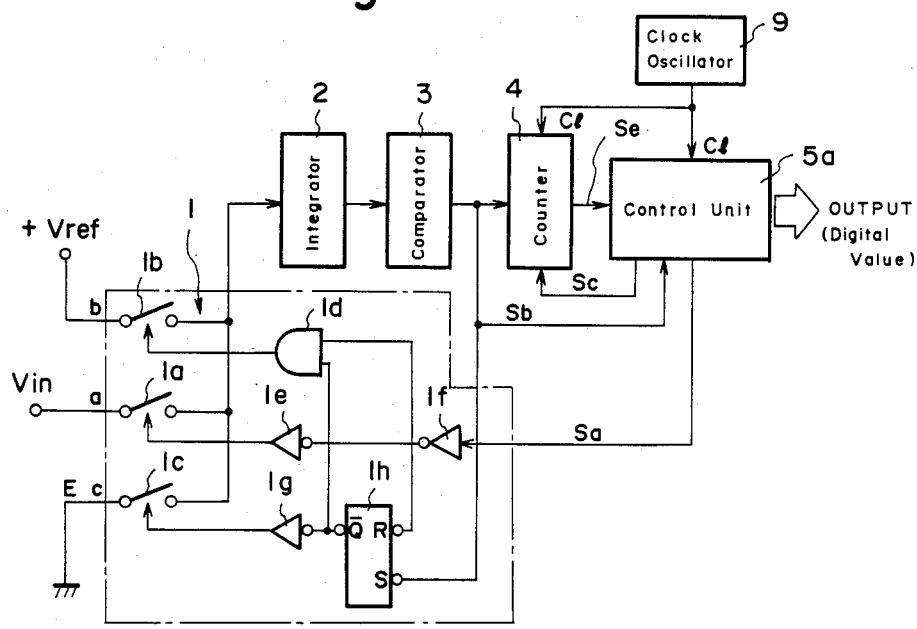
FIG. 1 is a block diagram of a first embodiment of a double integrating-type A/D converter according to the present invention.

Reference will now be had to the block diagram of FIG. 1 to describe a first embodiment of a double integrating-type A/D converter according to the present invention. The A/D converter includes an analog switch 1 located at the input side which switches between three inputs: a reference voltage $V_{ref}$, an analog voltage $V_{in}$, the magnitude of which is to be measured, and a ground potential E. The output terminal of the analog switch 1 is connected to an input of an integrator 2. The analog switch 1 includes switching sections 1a, 1b, 1c each comprising a functional device such as a field-effect transistor (FET), an AND gate 1d, inverters 1e, 1f, 1g, and a flip-flop (FF) 1h. The $\overline{Q}$ output terminal of the FF 1h is connected to the input side of the inverter 1g and to one input terminal of the AND gate 1d, the output from the $\overline{Q}$ output terminal actuate (i.e., opens or closes) the switching sections 1b and 1c, respectively. The output terminal of the inverter 1f is connected to the reset terminal R of the FF 1h, the input side of the inverter 1e and the other input terminal of the AND gate 1d. The output of the inverter 1e actuates the switching section 1a. The connections to the set terminal S of the FF 1h and to the input of the inverter 1f will be described hereinbelow.

The output of the analog switch 1 is an analog voltage connected to the input of the integrator 2, which integrates the analog voltage for a prescribed period of time. The output voltage provided by the integrator 2 is applied as an input to a comparator 3, which proceeds to compare the integrated output voltage with the voltage at which integration starts (ordinarily the offset voltage). When equivalence between these two voltages is achieved, the comparator 3 produces a count stop signal Sb connected to the set terminal S of the FF 1h, the input to a counter 4, and an input to a control unit 5a. In actuality, the count stop signal Sb is indicative of a change from a high to a low logic level, where the output terminal of the comparator 3 is low when the input signal is zero and high when the input signal is less than zero. The counter 4 is reset at the start of reverse integration by a reset command Sc from the control unit 5a, described in detail hereinbelow. The counter 4 starts counting at the instant it is reset, and stops counting in response to the count stop signal Sb from the comparator 3. The counter 4 produces a signal Se indicative of the value of the recorded count.

The control unit 5a comprises a microcomputer having a central processor, a program memory, a working memory and an input/output circuit. In addition to the count stop signal Sb, the control unit receives, as an input, the signal Se indicative of the count recorded in the counter 4. In accordance with a program stored in the program memory, the control unit 5a produces a switch command Sa connected to the input side of the inverter 1f, and the abovementioned reset command Sc connected to the reset terminal of the counter 4. The output of the control unit 5a is a digital signal obtained by integration of the analog signal $V_{in}$, which is the signal to be measured. The counter 4 and control unit 5a are clocked by a clock signal Cl of a suitable frequency, the signal being produced by a clock oscillator 9.

Figure 2:
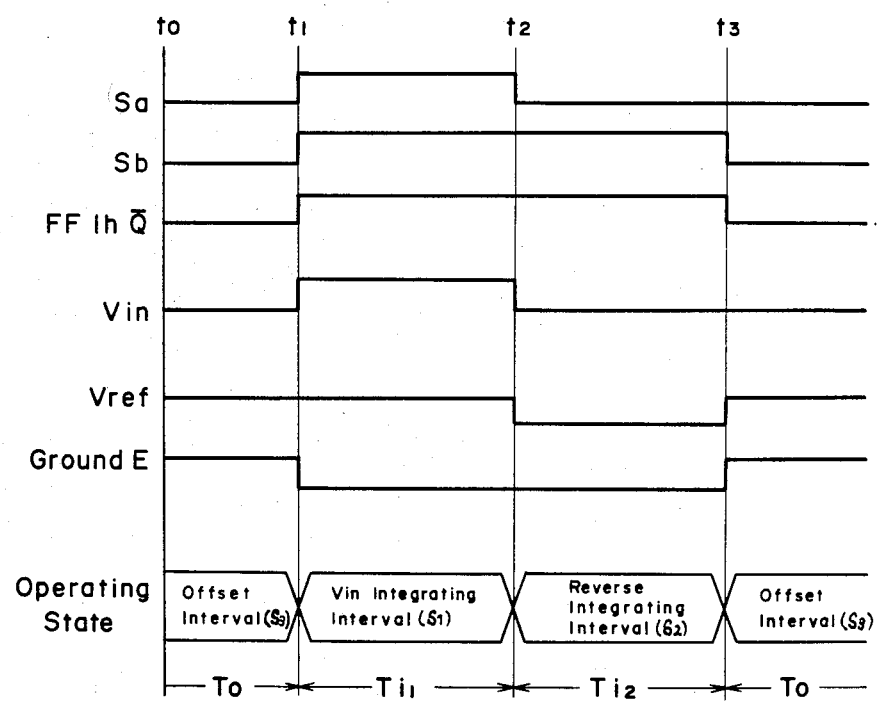
FIG. 2 is a time chart of signals associated with the first embodiment of the present invention.

The integration operation performed by the double integrating-type A/D converter of FIG. 1 will be described in conjunction with the timechart of FIG. 2. The first step is to actuate the analog switch 1 based on the switch command Sa produced by the control unit 5a, and the count stop signal Sb from the comparator 3. Specifically, as shown in FIG. 2, the integrator 2 is subjected to a zero-offset correction over an offset interval $T_o$ that includes a point in time $t_o$. The FF 1h is in the set state during the offset interval $T_o$, so that the $\overline{Q}$ output of FF 1h is at the low level, and the output of inverter 1g is high. The switching section 1c is closed as a result, thereby applying the ground potential E to the integrator 2. This in effect applies the zero-offset adjustment to the double-integrating A/D converter.

Next, at time $t_1$, the control unit 5a produces the switch command Sa (actually a low-to-high level transition), causing the $\overline{Q}$ output terminal of the FF 1h to assume the high level. The output of inverter 1g goes low to open the switching section 1c, while the output of inverter 1e goes high to close the switching section 1a. This causes the analog signal $V_{in}$ to be applied to the input terminal of the integrator 2, which now begins integrating the signal. The integration of the analog signal $V_{in}$ performed by the double-integrating A/D converter of the invention takes place over an interval $T_{i1}$. When the integrator 2 produces an analog output signal as a result of the integration operation, the output of the comparator 3 assumes the high logic level. Thus, there is no change in the operation of the double-integrating A/D converter despite the transition of the signal Sb from the low to the high level.

At time $t_2$, which is the instant at which the predetermined interval of time $T_{i1}$ elapses, the predetermined interval being determined by a software timer described below, the switch command Sa from the control unit 5a drops to the low level, whereupon the output of the inverter 1e goes low to open the switching section 1a, thereby ending the integration of the analog input signal $V_{in}$. At the same time, the output of the AND gate 1d goes high to close the switching section 1b and apply the reference voltage $V_{ref}$ (in an embodiment, $V_{ref}$ is a voltage having a polarity opposite to that of the analog signal $V_{in}$) to the integrator 2, whereby a reverse integration is carried out. As a result of performing the reverse integration, the output voltage produced by the integrator 2 becomes zero in magnitude at time $t_3$, at which time the output of the comparator 3 makes a transition from the high to low level, with the negative-going transition serving as the count stop signal Sb. When this occurs, FF 1h is set, sending the $\bar{Q}$ output thereof to the low level. This in turn sends the output of the inverter 1g high to close the switching section 1c, and disables the AND gate 1d to open the switching section 1b. The ground E therefore is applied to the integrator 2, restoring the offset interval $T_o$ at time $t_3$.

The foregoing operation is repeated periodically in accordance with the program stored in the control unit 5a. More specifically, the control unit 5a is programmed to include a working sequence and working time, namely a period $S_1$ and interval $T_{i1}$ for integrating the analog input signal $V_{in}$, and an offset period $S_3$ and offset interval $T_0$. In particular, the control unit 5a is so adapted that the integrating interval $T_{i1}$ over which the analog input signal $V_{in}$ is integrated can be set at will to any value whatsoever by the state of the input signal. That is, the control unit 5a is provided with a so-called software timer for varying the interval $T_{i1}$ over which the analog input signal $V_{in}$ is integrated.

Figure 3:
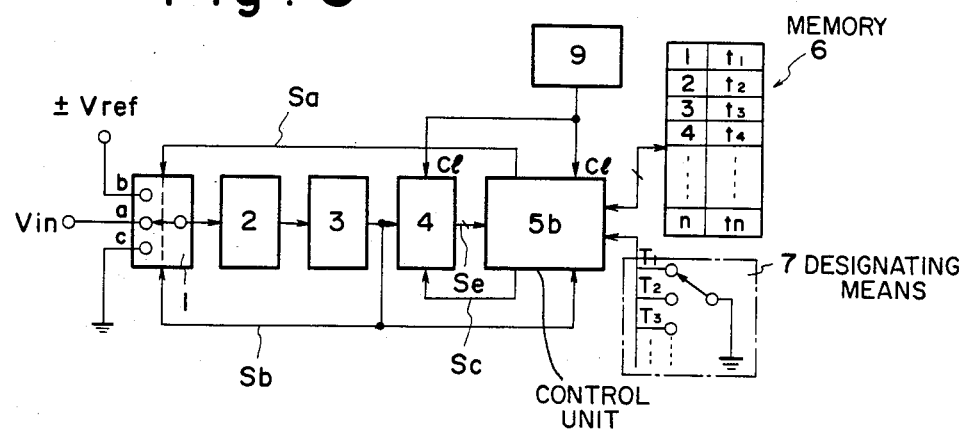
FIGS. 3 through 7 are block diagrams of second through sixth embodiments of a double integrating-type A/D converter according to the present invention.

FIG. 3 is a block diagram of an embodiment in which the interval $T_{i1}$ for integrating the analog input signal $V_{in}$ can be set by setting means provided external to the double-integrating A/D converter. The analog switch 1 is illustrated as a simple block, with other portions similar to those of FIG. 1 being designated by like reference characters. These portions will not be described in detail again in order to avoid prolixity. In FIG. 3, the control unit 5b, the construction of which is similar to the construction of the control unit 5a in FIG. 1, is provided with a memory 6 for storing a plurality of different set times $t_1, t_2, t_3, \ldots t_n$, and with designating means 7 for selecting a set time. The designating means 7 comprises a suitable changeover switch having a dial or the like which, by being manipulated, selects the desired set time. When this is done, an integrating interval corresponding to the time selected by the designating means 7 is chosen within the memory 6. When the program step for setting the integrating interval $T_{i1}$ is reached, the integrating inverval $T_{i1}$ selected from the memory 6 is read into the control unit 5a, whereby the analog input signal $V_{in}$ is integrated for a period of time equivalent to the selected interval.

Figure 4:
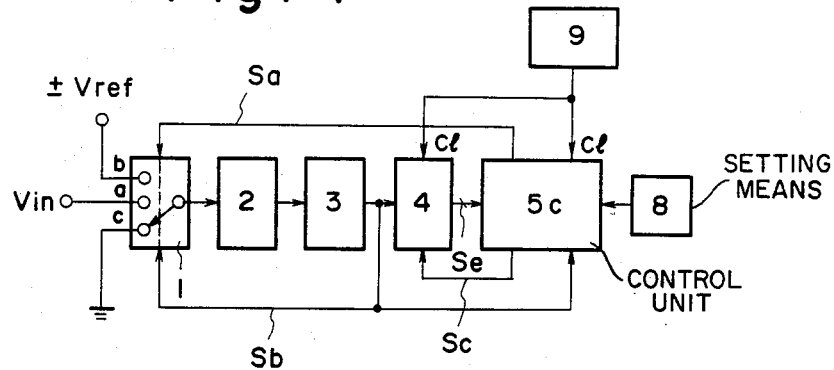

FIG. 4 is a block diagram of another embodiment in which the interval $T_{i1}$ for integrating the analog input signal $V_{in}$ can be set by setting means provided external to the double-integrating A/D converter. As in FIG. 3, the analog switch 1 is illustrated as a simple block, with other portions similar to those of FIG. 1 being designated by like reference characters. These portions need not be described again in detail. In FIG. 4, the control unit 5c, the construction of which is similar to the construction of the control unit 5a in FIG. 1, is provided with setting means 8 for setting the interval $T_{i1}$ over which the analog input signal $V_{in}$ is integrated. The setting means 8 is provided with, e.g., a digital switch or numeric key arrangement for producing a set time output in the form of a digital value applied to the control unit 5c. The setting means 8 is set to the desired integrating interval $T_{i1}$ before the double-integrating A/D converter is set into operation.

In the three embodiments of FIGS. 1, 3 and 4, a suitable integrating interval $T_{i1}$ is selected based upon the particular application of the double-integrating A/D converter and the level of the input signal. The conversion precision of the double-integrating A/D converter is prevented from declining by lengthening the integrating interval in cases when the input signal level is low, and shortening the integrating interval when the input signal level is high. Thus, according to the double-integrating A/D converter of the present invention, no adjustment of the analog input signal level is necessary.

In each of the foregoing embodiments, the counter 4 has a large capacity and, hence, is considerably high in cost, regardless of the length of the reverse integrating interval $T_{i2}$, that is, the magnitude of the reverse integration value. This drawback can be eliminated by adopting the following embodiments illustrated in FIGS. 5 through 7, as will now be described.

Figure 5:
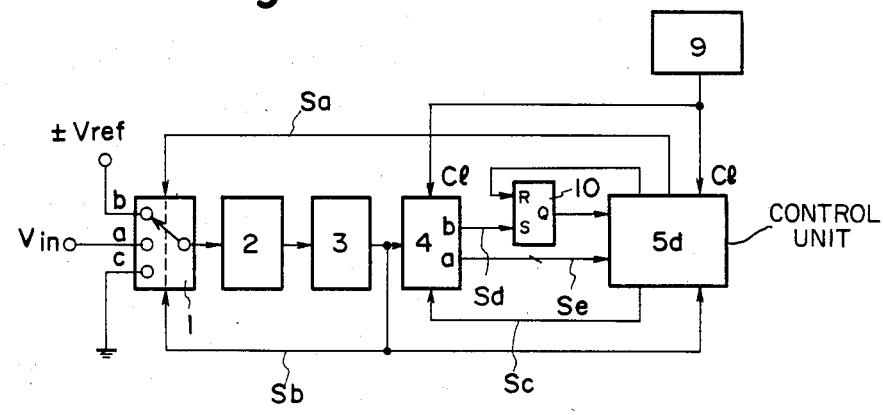

FIG. 5 is a block diagram of a fourth embodiment of the present invention, in which portions similar to those of FIG. 1 are designated by like reference characters. The counter 4 has a construction similar to that of the counter 4 in FIG. 1 but need not have a very large capacity. The counter 4 is provided with a terminal a at which the signal Se indicative of the recorded count appears, and with an overflow terminal b at which an overflow signal Sd is produced whenever the recorded count overflows. The overflow terminal b is connected to the set terminals S of a FF 10. The Q output of the FF 10 is connected to an input of the control unit, here designated as 5d. The FF 10 is reset by a reset signal produced by the control unit 5d. The purpose of the FF 10 is to latch the overflow signal Sd from the counter 4. Accordingly, when the overflow signal Sd is applied to the set terminal S thereof, the Q output terminal of the FF 10 goes high. Upon subsequently reading in the high level signal at the Q output of the FF 10, the control unit 5d computes a total output count from the prevailing count Se and from the number of overflows recorded up to that point in time. In this way the output count of the double-integrating A/D converter is increased irrespective of the construction of the counter 4. This makes it possible to raise the resolution of the inverter at will.

Figure 6:
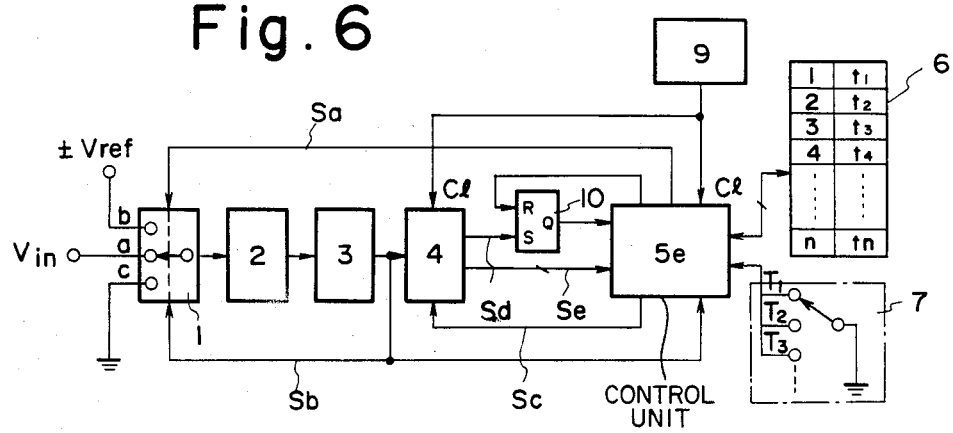
Figure 7:
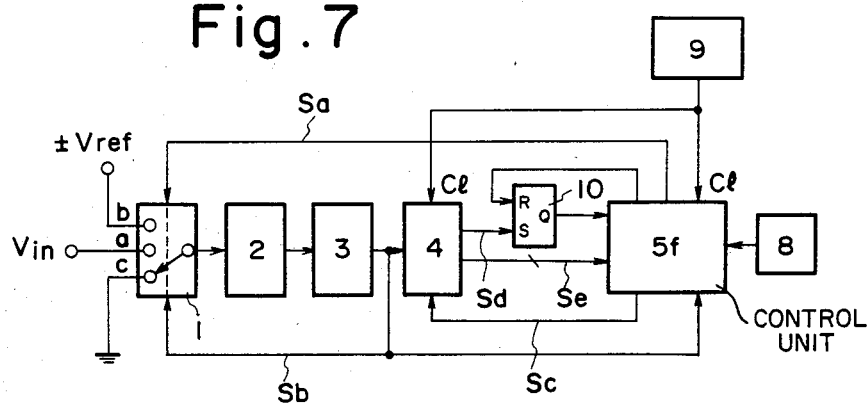

FIGS. 6 and 7 are fifth and sixth embodiments of the present invention, wherein the embodiments of FIGS. 6 and 7, respectively, are equipped with the FF 10 for latching the overflow signal Sd produced by the counter 4. These embodiments operate in the same fashion as the fourth embodiment shown in FIG. 5. The control unit is designated by 5e in FIG. 6, and by 5f in FIG. 7.

It should be noted that the FF 10 can be deleted from the foregoing arrangements if a signal indicative of the most significant digit of the counter 4 is used as the overflow signal.

The control operations performed by the control units 5a through 5f in the foregoing embodiments will now be described. It should be noted, however, that the control operations performed by the control units 5a, 5b and 5d in FIGS. 1, 3 and 5, respectively, are covered by the control operation executed by the control unit 5e of FIG. 6, so that a description solely of the latter control operation will suffice. Likewise, the control operation carried out by the control unit 5c in FIG. 4 is covered by that executed by the control unit 5f of FIG. 7, so only the latter control operation will be described.

Figure 8:
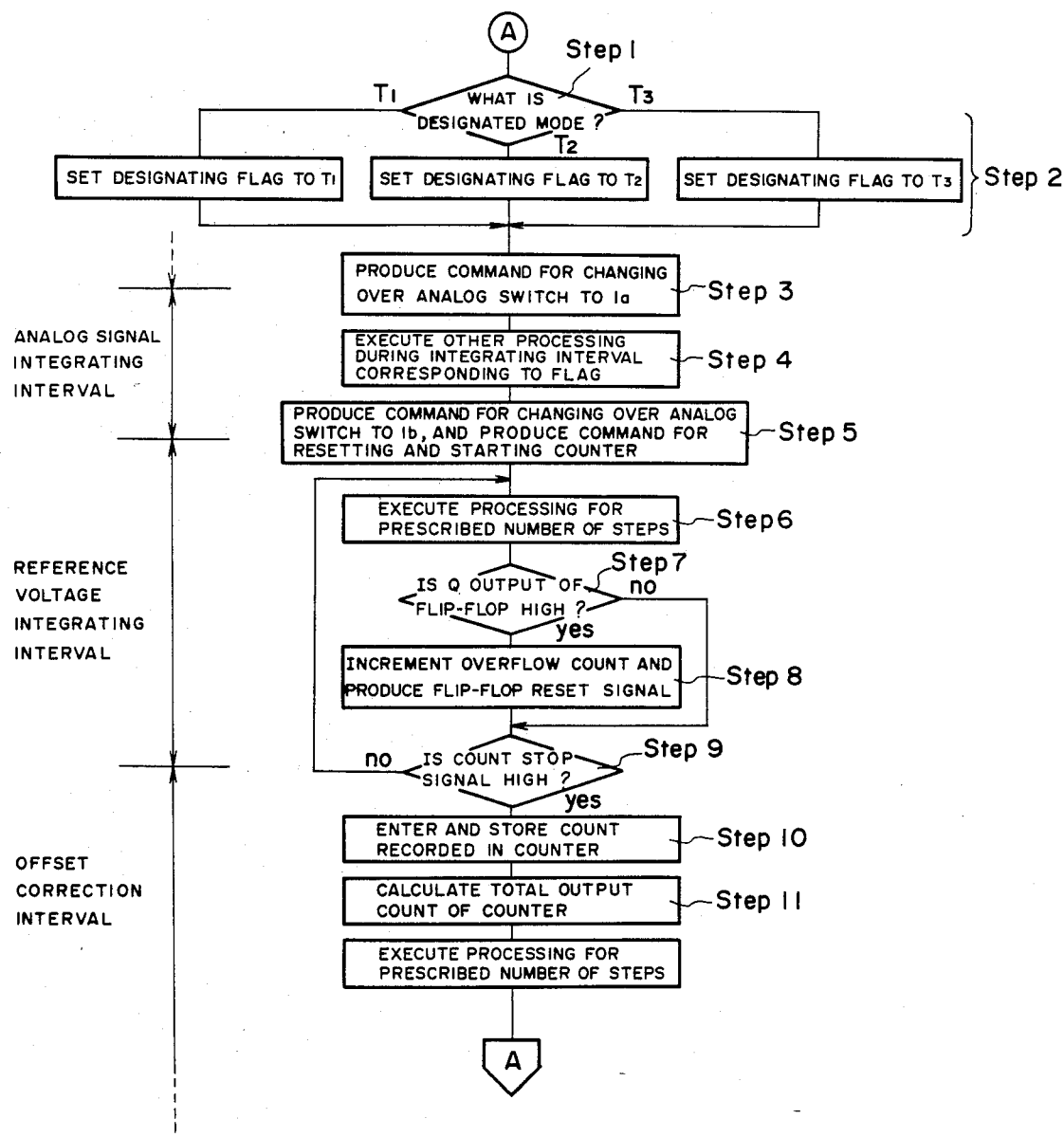
FIG. 8 is a flowchart of the operation of a control unit (5e) included in the embodiment shown in FIG. 6.

An example of the control performed by the control unit 5e of FIG. 6 is illustrated in the flowchart of FIG. 8. We shall assume that the switching section 1c of the analog switch 1 is in the closed state owing to the count stop signal Sb from the comparator 3 at the start of operation. When the control program is executed under these conditions, the control unit 5e in step 1 checks the designating means 7 to discriminate the integrating interval designated thereby. The control unit 5e then executes step 2, in which a designating flag corresponding to the designated interval is set, followed by step 3 in which the command Sa is issued to open the switching section 1c and close the switching section 1a of the logic switch 1. The integrator 2 starts integrating the analog input signal $V_{in}$ as a result of these process steps.

While the control unit 5e is executing other processing (arithmetic and logic processing, display processing, etc.) in step 4, it also monitors the integrating interval on the basis of these process steps and, when equivalence is detected between the integrating interval and the set time corresponding to the designating flag, executes step 5, wherein the command Sa is issued to close the switching section 1b of the analog switch 1, together with the command Sc for resetting and starting the counter 4. As a result, integration of the analog input signal $V_{in}$ ends, followed by starting the integration of the reference voltage $V_{ref}$ and the counting operation of the counter 4.

Figure 9:
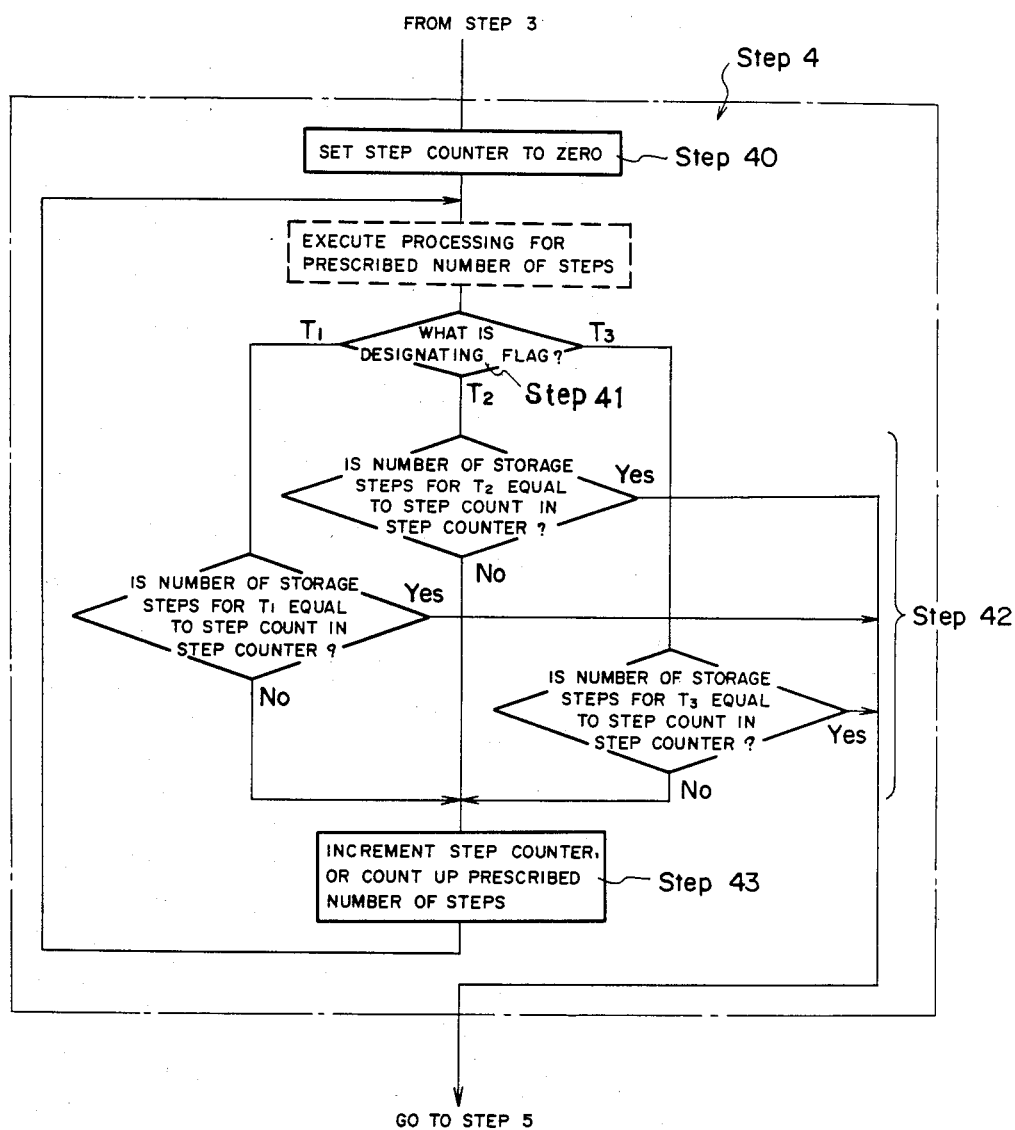
FIG. 9 is a flowchart of the details of step 4 in the flowchart of FIG. 8.

FIG. 9 is an example of a flowchart indicating the details of step 4 in the flowchart of FIG. 8. Here a step counter is used to monitor the integrating interval based on the number of process steps. More specifically, the step counter is set to zero in step 40, the aforementioned designating flag is discriminated in the next step 41, and the integrating interval corresponding to this designating flag is monitored in step 42. This last operation is performed by comparing the number of storage steps, which is equivalent to the designated integrating interval, with the count recorded in the step counter, and discriminating whether the two coincide. If the decision rendered is negative, namely non-coincidence, step 43 is executed, wherein the step counter is incremented (or, where the process step enclosed by the broken line is inserted, a prescribed number of steps is incremented), after which processing returns to step 41. When equivalence is established between the number of storage steps and the counted value in the step counter during repetition of the processing specified by the foregoing loop, the system leaves the loop and shifts to step 5 of the flowchart shown in FIG. 8. When other processing is executed concurrently with the processing associated with the foregoing loop, a certain number of steps are executed between step 43 and 41, as indicated by the broken line in FIG. 9.

When the processing of step 5 ends, the control unit 5e repeatedly checks the Q output of FF 10 and periodically checks the count stop signal Sb from comparator 3. More specifically, in step 6, the control unit 5e executes the processing of a certain number of steps within an interval of time shorter than that needed for the counter 4 to produce the overflow signal Sd, and then checks the Q output of the FF 10 in step 7. Since the Q output initially is low, in this case processing skips step 8 and moves to step 9, where the count stop signal Sb is investigated. If the decision rendered in this block is that the count stop signal Sb is at the low level, the system returns to step 6 to repeat execution of the specified processing. Since the Q output of FF 10 will make the transition to the high level when the processing of step 6 ends, the overflow count is incremented and a signal is produced by the control unit 5e to reset FF 10 in the next step 8.

Next, in step 9, the control unit 5e checks the count stop signal Sb from the comparator 3. If Sb is low, the system returns to step 6; if high, integration of the reference voltage ends and, at the same time, the switching section 1c of the analog switch 1 is closed. Therefore, in step 10, the value of the count Se recorded in the counter 4 is entered and stored. This is followed by step 11, in which the control unit 5e calculates the total output count of the counter 4 from the overflow count, obtained in step 8, and from the value of the count recorded in the counter 4. Then, after a certain number of steps are executed, processing returns to step 1 and the foregoing control operation is repeated.

Note that alteration of the integrating interval as described above is unnecessary in the embodiments of FIGS. 1 and 5. Therefore, the control units 5a and 5d need not execute the foregoing steps 1, 2 and 41, 42. Also, since overflow of the counter 4 is not checked in the arrangements of FIGS. 3 and 4, the process steps 7, 8 and 11 are deleted.

Figure 10:
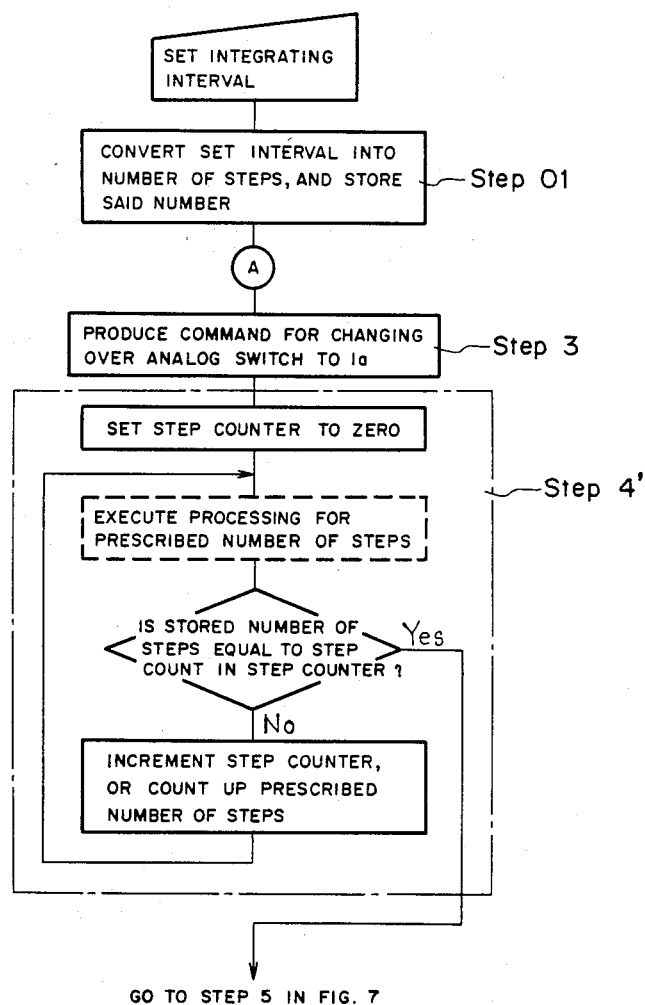
FIG. 10 is a flowchart of a portion of the operation of a control unit (5f) included in the embodiment of FIG. 7.

FIG. 10 is a flowchart of an example of the control operation performed by the control unit 5f of FIG. 7. Only portions that differ from those shown in FIG. 8 are illustrated. In this case, rather than executing process steps 1 and 2, a process step 01 is inserted for converting the set time into a number of steps and for storing the result. The process step 4' inserted between steps 3 and 5 represents a simplification over the processing shown in FIG. 9.

Likewise, the control operation performed by the control unit 5c of FIG. 4 proceeds in a similar manner within the scope of the processing illustrated in FIG. 10.

It goes without saying that the present invention is not limited to the embodiments described hereinabove. Further, the control units 5a through 5f may be units for controlling solely the analog switch, or units for executing other processing as well, such as processing associated with the keys, display and computations in an electronic weigher or the like.

Figure 11:
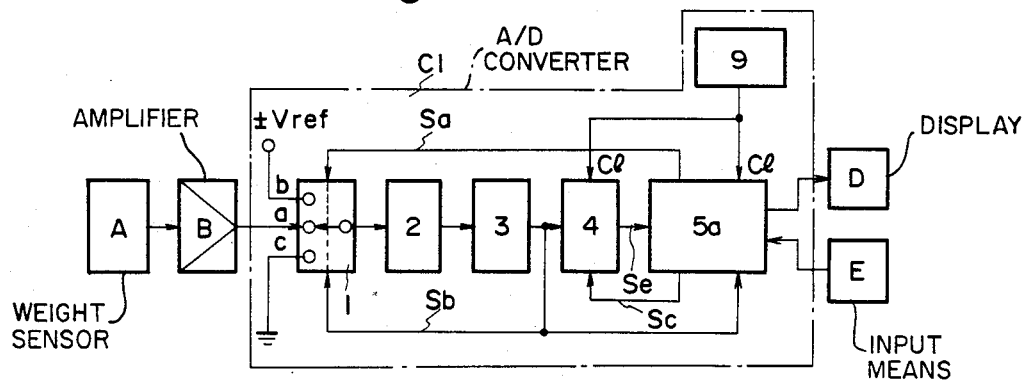
FIGS. 11 through 13 are block diagrams of seventh through ninth embodiments of a double integrating-type A/D converter according to the present invention.

Described next will be an embodiment in which the present invention is applied to the weight sensing section of an electronic weigher. This seventh embodiment of the invention is illustrated in FIG. 11 and includes a weight sensor A comprising a load cell for sensing the weight of a batch of articles and for producing an analog signal indicative of the sensed weight, an amplifier circuit B for amplifying the analog signal received as an input from the weight sensor A, and an A/D converter C1 which comprises the double-integrating A/D converter illustrated in FIG. 1, and which receives the amplified analog signal from the amplifier circuit B as an input thereto. A display device D is controlled by the control unit 5a to display such information as the measured weight of the article batch. The control unit 5a is provided with input means E for entering such information as the unit price and unit weight of the articles, tare, etc. The operation of the double-integrating A/D converter C1 is as described hereinabove in connection with FIGS. 6 and 8 and need not be described again.

Figure 12:
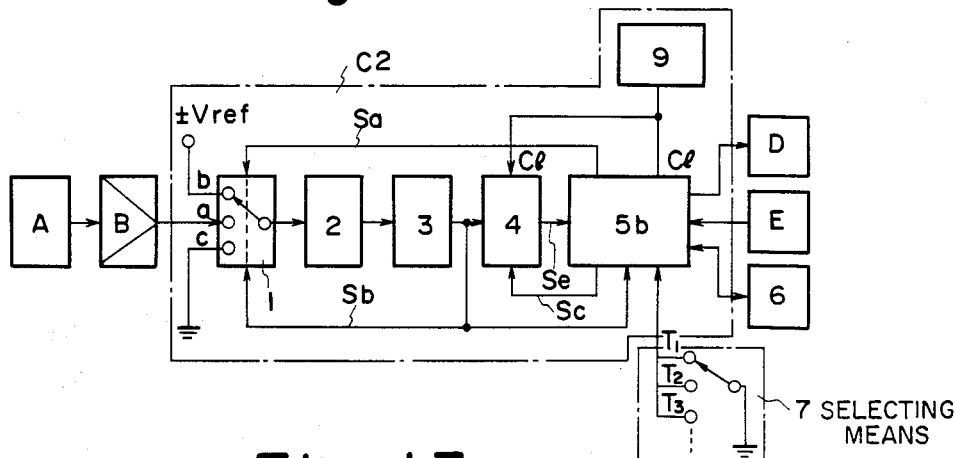
Figure 13:
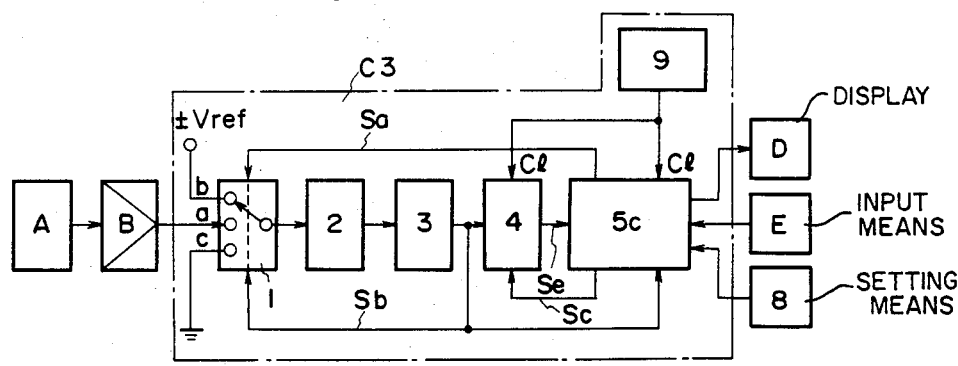

An eighth embodiment of the invention is illustrated in FIG. 12 and includes the weight sensor A comprising a load cell, the amplifier circuit B for amplifying the output signal produced by the weight sensor A, and an A/D. converter C2 comprising the double-integrating A/D converter of FIG. 3 for converting the analog output of the amplifier circuit B into a digital signal. A ninth embodiment of the invention is illustrated in FIG. 13 and includes the weight sensor A comprising a load cell, the amplifier circuit B for amplifying the output signal produced by the weight sensor A, and an A/D converter C3 comprising the double-integrating A/D converter to FIG. 4 for converting the analog output of the amplifier circuit B into a digital signal.

Thus, in the electronic weigher illustrated in FIG. 11, a program for a software timer is altered to obtain a digital signal indicative of the desired counted value. In the electronic weighers of FIGS. 12 and 13, the digital signal of the desired counted value can be obtained by altering the time to which the software timer is set. It is therefore unnecessary to change the amplification of the amplifier circuit B connected to the input side of the double-integrating A/D converters C1, C2 and C3, thereby making it possible to directly obtain the weighing capacity of an electronic weigher.

By way of example, assume that three electronic weighers having respective weighing capacities of 5 kg, 10 kg and 20 kg are to be manufactured using a weight sensor A designed to produce an output voltage of 20 mv when subjected to a load of 20 kg, and an amplifier circuit B having an amplification of 100. By setting the integrating interval of the analog signal from the weight sensor to the values shown in the following table, the maximum output count of the double-integrating A/D converters C1, C2 and C3 can be made the same for each of the electronic weighers.

| Weighing Capacity | Cell Output | Amplifier Output | Integrating Interval | Output Count |
|---|---|---|---|---|
| 5 kg | 5 mv | 0.5 v | 4 × T | 10000 |
| 10 kg | 10 mv | 1 v | 2 × T | 10000 |
| 20 kg | 20 mv | 2 v | 1 × T | 10000 |

Figure 14:
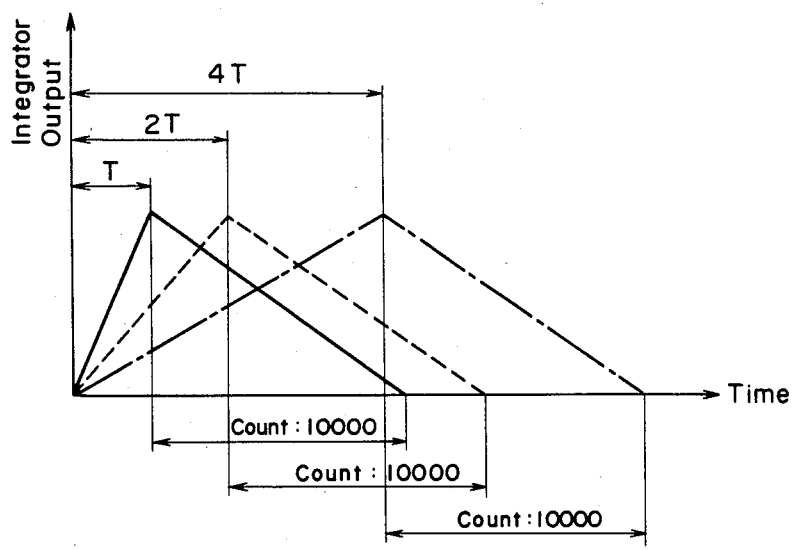
FIG. 14 is a timechart showing the relationship between output count and the integrating interval of an analog signal where the integrating interval is changed.

FIG. 14 is a timechart showing the relation between the integrating interval and the output count where the three double-integrating A/D converters C1, C2 and C3 are operated over the integrating intervals given in the table above.

The control units 5a through 5c in the embodiments of FIGS. 11 through 13 execute control operations ordinarily associated with an electronic weigher, in addition to the operations for controlling the analog switch 1. If necessary, however, separate control units can be provided, one exclusively for controlling the analog switch 1, the other for controlling the electronic weigher. In addition, the time to which the software timer is set is given by a number of steps equivalent to the set time, with a certain number of steps being stored as the set time in the memory 6.

The selecting means 7 in FIG. 12 is a suitable change-over switch which is used as a weighing range change-over switch. The setting means 8 in FIG. 13 is comprised of, e.g., a digital switch, a group of numeric keys or a DIP switch, and can even be used as span adjusting means. Specifically, a span adjustment can be carried out by bringing the output count of the double-integrating A/D converter, when a reference counterweight is applied, into agreement with a reference count corresponding to the magnitude of the counterweight. Therefore, if an adjustment for bringing the output count into agreement with the reference count is performed by regulating the integrating interval through use of the setting means 8, the span adjustment of the electronic scale can be performed with facility.

Figure 15:
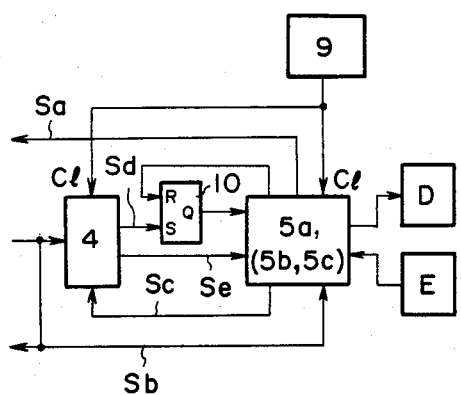
FIG. 15 is a block diagram of an arrangement which may be applied to the seventh through ninth embodiments of the invention in order to check a counter overflow signal.

FIG. 15 is an arrangement which enables the output count, or resolution, of the double integrating A/D converters C1, C2 and C3 in the embodiments of FIGS. 11 through 13 to be raised at will without imposing any restriction upon the output count of the counter 4. More specifically, FF 10 in FIG. 15 latches the overflow signal Sd from the counter 4. When the overflow signal is applied to the set terminal S of the FF 10, the Q output thereof goes high. When the high-level Q output is read in the by control unit 5a (5b, 5c), the latter increments the overflow count recorded in the counter 4 and resets FF 10. Upon reading in the count stop signal Sb produced by the comparator 3, the control unit 5a (5b, 5c) calculates the total output count from the overflow count thus far and from the output count Se recorded in the counter 4. Thus, the output count of the double-integrating A/D converter is increased irrespective of the construction of the counter 4, thereby making it possible to raise the resolution of the inverter at will. The FF 10 can be deleted from the foregoing arrangements if a signal indicative of the most significant digit of the counter 4 is used as the overflow signal.

As many apparently widely different embodiments of the present invention can be made without departing from the spirit and scope thereof, it is to be understood that the invention is ot limited to the specific embodiments thereof except as defined in the appended claims.

What is claimed:

1. A double integrating-type analog-to-digital converter comprising:
    switching means, having an output terminal and having an input terminal operatively connected to receive at least a first input signal which is an analog voltage signal to be measured, and a second input signal which is a reference voltage opposite in polarity to the analog voltage signal, for switching between the first and second input signals;
    integrating means, having an input side operatively connected to the output terminal of said switching means and having an output side for outputting an output signal, for integrating the analog voltage over a predetermined integrating interval when said switching means selects the analog voltage signal, and for reverse-integrating the reference voltage when said switching means subsequently selects the reference voltage, until the output signal of said integrating means attained a predetermined value;
    counting means, operatively connected to said integrating means, for measuring the time interval required for the reverse integration performed by said integrating means;
    memory means for storing a plurality of different set time intervals; and control means, operatively connected to said switching means and said counting means, for controlling said switching means and said counting means, said control means having a computer for controlling the predetermined integrating interval of the analog voltage on the basis of a number of steps executed by said computer, the integrating interval being set by said computer and being selected from among said plurality of different set time intervals stored in said memory means, the analog voltage being applied to said integrating means for a period of time equivalent to the integrating interval set by said computer.

2. An analog-to-digital converter according to claim 1, further comprising time interval setting means, wherein the integrating interval set by said computer is determined by said time interval setting means.

3. A double integrating-type analog-to-digital converter comprising:
switching means, having an output terminal and having an input terminal operatively connected to receive at least a first input signal which is an analog voltage signal to be measured, and a second input signal which is a reference voltage opposite in polarity to the analog voltage signal, for switching between the first and second input signals;
integrating means, having an input side connected to the output terminal of said switching means and having an output terminal for outputting a signal, for integrating the analog voltage over a predetermined integrating interval when said switch means selects the analog voltage signal, and for reverse-integrating the reference voltage when said switching means subsequently selects the reference voltage, until the output signal from said integrating means attains a predetermined value;
counting means, operatively connected to said integrating means, for measuring the time interval required for the reverse integration performed by said integrating means, and for generating an overflow signal; and
control means, operatively connected to said switching means and said counting means, for controlling said switching means and said counting means, said control means having a computer for controlling the predetermined integrating interval of the analog voltage on the basis of a number of steps executed by the computer, the analog voltage being applied to said integrating means for a period of time equivalent to the integrating interval set by said computer, and said control means calculates a digital value, which corresponds to the analog signal, from a count recorded in said counting means and from an overflow value indicated by the overflow signal generated by said counting means.

4. An analog-to-digital converter according to claim 3, further comprising a memory for storing a plurality of different set time intervals, wherein the integrating interval set by said computer is selected from among said stored plurality of different set time intervals.

5. An analog-to-digital converter according to claim 3, further comprising time interval setting means, wherein the integrating interval set by said computer is determined by said time interval setting means.

6. A double integrating-type analog-to-digital converter for use in a weight sensing section of an electronic weigher, comprising:
a weight sensor for sensing the weight of an article and for producing an analog voltage signal indicative of the sensed weight;
an amplifier circuit, operatively connected to said weight sensor, for receiving and amplifying the analog voltage signal produced by said weight sensor;
switching means, operatively connected to said amplifier circuit, having an output terminal and having an input terminal operatively connected to receive at least a first input signal which is the analog voltage signal produced by said weight sensor and a second input signal which is a reference voltage opposite in polarity to the analog voltage signal, for switching between at least the first and second input signals;
integrating means, having an input side connected to the output terminal of said switching means and having an output terminal for outputting a signal, for integrating the analog voltage over a predetermined integrating interval when said switching means selects the analog voltage signal, and for reverse-integrating the reference voltage, when said switching means subsequently selects the reference voltage, until the output signal from said integrating means attains a predetermined value;
counting means, operatively connected to said integrating means, for measuring the time interval required for the reverse integration performed by said integrating means;
memory means for storing a plurality of different set time intervals; and
control means, operatively connected to said switching means and said counting means, for controlling said switching means and said counting means, said control means having a computer for controlling the predetermined integrating interval of the analog voltage on the basis of a number of steps executed by said computer, the integrating interval being set by said computer and being selected from among said plurality of different set time intervals stored in said memory means, the analog voltage being applied to said integrating means for a period of time equivalent to the integrating interval set by said computer.

7. An analog-to-digital converter according to claim 6, further comprising time interval setting means, wherein the integrating interval set by said computer is determined by said time interval setting means.

8. A double integrating-type analog-to-digital converter for use in a weight sensing section of an electronic weigher, comprising:
a weight sensor for sensing the weight of an article and for producing an analog voltage signal indicative of the sensed weight;
an amplifier circuit, operatively connected to said weight sensor and having a fixed amplification, for receiving and amplifying the analog voltage signal produced by said weight sensor;
switching means, having an output terminal and having an input terminal operatively connected to said amplifier circuit and operatively connected to receive at least a first input signal which is the analog voltage signal produced by said weight sensor and a second input signal which is a reference voltage opposite in polarity to the analog voltage signal, for switching between at least the first and second input signals;

integrating means, operatively connected to said switching means, having an input terminal connected to the output terminal of said switching means and having an output terminal for outputting a signal, for integrating the analog voltage over a predetermined integrating interval when said switching means selects the analog voltage signal, and for reverse-integrating the reference voltage when said switching means subsequently selects the reference voltage, until the output signal from said integrating means attains a predetermined value;

counting means, operatively connected to said integrating means, for measuring the time interval required for the reverse integration performed by said integrating means, and for generating an overflow signal; and control means, operatively connected to said switching means and said counting means, for controlling said switching means and said counting means, said control means having a computer for controlling the predetermined integrating interval of the analog voltage on the basis of a number of steps executed by the computer, the analog voltage being applied to said integrating means for a period of time equivalent to the integrating interval set by said computer, and said control means calculating a digital value, which corresponds to the analog voltage, from a count recorded in said counting means and from an overflow value indicated by the overflow signal generated by said counting means.

9. An analog-to-digital converter according to claim 8, further comprising a memory for storing a plurality of different set time intervals, wherein the integrating interval set by said computer is selected from among said stored plurality of different set time intervals.

10. An analog-to-digital converter according to claim 9, further comprising time interval setting means, wherein the integrating interval set by said computer is determined by said time interval setting means.

11. A double integrating-type analog-to-digital converter, operatively connectable to receive at least an analog voltage signal and a reference voltage having a polarity opposite that of the analog voltage signal, comprising:

switching means, having input terminals operatively connected to receive the analog voltage signal and the reference voltage, for switching between the analog voltage signal and the reference voltage, and having an output terminal for outputting a signal;

integrating means, operatively connected to said output terminal of said switching means, for integrating the analog voltage over a predetermined integrating interval when the analog voltage signal is selected and for reverse-integrating the reference voltage when the reference voltage is selected, the integrating or reverse-integrating operations being performed until an output from said integrating means attains a predetermined value;

counting means, operatively connected to said integrating means, for measuring the time interval required for the reverse-integrating operation;

memory means for storing different set time intervals;

control means, operatively connected to said switching means and said counting means, for controlling said switching means and said counting means and including a computer, operatively connected to said memory means, for setting the predetermined integrating interval in accordance with one of the set time intervals stored in said memory means, said control means controlling the predetermined integrating interval of the analog voltage on the basis of a number of steps executed by said computer.

12. An analog-to-digital converter according to claim 11, further comprising a time interval setting means, operatively connected to said computer for determining the interval to be set by said computer.

13. An analog-to-digital converter according to claim 11, wherein said counting means generates an overflow signal and has a count stored therein, and wherein said control means calculates a digital value corresponding to the analog voltage signal in dependence upon the count stored in said counting means and the overflow signal generated by said counting means.

14. An analog-to-digital converter according to claim 11, further comprising:

an amplifier circuit operatively connected to said switching means; and a weight sensor, operatively connected to said amplifier, for sensing the weight of an article and producing the analog voltage, which is indicative of the sensed weight, said amplifier receiving and amplifying the analog voltage signal.

15. An analog-to-digital converter according to claim 14, further comprising interval setting means, operatively connected to said computer, for determining the integrating interval to be set by said computer.

* * * * *

UNITED STATES PATENT AND TRADEMARK OFFICE
CERTIFICATE OF CORRECTION

PATENT NO. : 4,620,178
DATED : OCTOBER 28, 1986
INVENTOR(S) : KAZUFUMI NAITO

It is certified that error appears in the above-identified patent and that said Letters Patent is hereby corrected as shown below:

Col. 6, line 36, "a" second occurrence, should read -- $\underline{a}$ --.
 line 38, "b" should be --$\underline{b}$--;
 line 40, "b" should be --$\overline{\underline{b}}$--;
 line 41, "terminals" should be --terminal--.

Col. 7, line 12, after "control" (first occurrence) insert --operation--.

Col. 10, line 39, "ot" should be --not--;
 line 61, "attained" should be --attains--.

Signed and Sealed this

Third Day of March, 1987

Attest:

DONALD J. QUIGG

Attesting Officer

Commissioner of Patents and Trademarks